United States Patent [19]

Bohm et al.

[11] Patent Number: 5,135,827
[45] Date of Patent: Aug. 4, 1992

[54] PROCESS FOR THE MANUFACTURE OF PHOTOPOLYMER PLATES

[75] Inventors: Dieter Bohm, Eltville; Raimund-Josef Faust, Wiesbaden; Joachim Gersdorf, Wiesbaden; Rudolf Petry, Wiesbaden; Hans-Joachim Schlosser, Wiesbaden, all of Fed. Rep. of Germany

[73] Assignee: Hoechst Aktiengesellschaft, Frankfurt am Main, Fed. Rep. of Germany

[21] Appl. No.: 654,578

[22] Filed: Feb. 13, 1991

[30] Foreign Application Priority Data

Feb 14, 1990 [DE] Fed. Rep. of Germany .......... 4004512

[51] Int. Cl.$^5$ .................. G03F 7/16; G03F 7/033; G03F 7/00
[52] U.S. Cl. ...................... 430/30; 430/306; 430/309; 430/327; 430/286; 430/281; 430/935; 430/271; 430/330; 430/287
[58] Field of Search ............... 430/306, 309, 327, 286, 430/270, 281, 935, 30, 271, 330, 287

[56] References Cited

U.S. PATENT DOCUMENTS

| | | | |
|---|---|---|---|
| 4,369,246 | 1/1983 | Chen et al. | 430/306 |
| 4,423,135 | 12/1983 | Chen et al. | 430/271 |
| 4,927,739 | 5/1990 | Taniguchi et al. | 430/286 |
| 5,015,556 | 1/1991 | Martens | 430/327 X |
| 5,049,478 | 9/1991 | Koch et al. | 430/270 |

FOREIGN PATENT DOCUMENTS

| | | |
|---|---|---|
| 0080665 | 6/1983 | European Pat. Off. . |
| 3833650 | 4/1990 | Fed. Rep. of Germany ....... 430/935 |
| 1358062 | 6/1974 | United Kingdom . |

OTHER PUBLICATIONS

"Der Extruder als Plastifiziereinheit", (The extruder as plasticizing unit), VDI-Verlap, Dusseldorf, 1977, pp. 115, 161-170.

Primary Examiner—Cynthia Hamilton
Attorney, Agent, or Firm—Foley & Lardner

[57] ABSTRACT

A continuous process for the manufacture of photopolymer plates having a precise and constant thickness in which the components of the photopolymer layer are melted in a screw extruder, the melt is conveyed to the sheet die by means of a gear pump and then into a roll gap of a calender, wherein the melt leaving the sheet die does not form a rotating bead in the calender gap downstream therefrom. The photopolymer plates prepared in this manner have high homogeneity of the components of the photopolymerizable mixture, have a highly precise and constant thickness, are transparent, do not tend to form specks and guarantee a long shelf life.

27 Claims, No Drawings

PROCESS FOR THE MANUFACTURE OF PHOTOPOLYMER PLATES

BACKGROUND OF THE INVENTION

The present invention relates to a process for the manufacture of photopolymer plates having a highly constant thickness and high homogeneity, in which a mixture of a thermoplastic polymer, at least one ethylenically-unsaturated compound, a photoinitiator and, if appropriate, further solid and/or liquid additives is extruded and then calendered.

Photopolymer plates are used, for example, for producing relief plates for letterpress printing, particularly flexographic printing. The plates used for this purpose, which have thicknesses between about 0.5 and 7 mm, must have a highly precise and constant thickness in order to minimize the deviations occurring in the thickness of the thermoplastic material with respect to width and processing direction during the continuous manufacturing process. Apart from the constant thickness of the product, a reproducibly adjustable homogeneity of the composition of the thermoplastic materials is also essential.

U.K. Patent No. 1,358,062 and U.S. Pat. No. 4,423,135 disclose the preparation of light-sensitive layers comprising a thermoplastic polymer, an ethylenically-unsaturated compound, a photoinitiator and further additives by homogenizing the components in a mixing apparatus, for example, in an internal mixer, a roll mixer or a mill, in combination with melting of the polymer, and then forming photopolymer layers from this mixture in a separate processing step by extrusion, calendering or platen-press molding. In this process, a disadvantage is the batchwise procedure. Exposure of the material to thermoplastic stress, which takes place at least twice, can lead to a change in the mixing components; the result can be troublesome gel formation and nonhomogeneity.

EP-A 0,080,665 describes a process in which, in a self-cleaning twin-screw extruder, the mixing components are melted and homogenized and the melt is discharged through a sheet die into the gap of a two-roll calender with formation of a rotating bead and shaped to give photopolymer plates. It is said to be crucial for achieving the desired precision and constant thickness of the layer that a rotating bead comprised of the material to be processed be formed before the roll gap. The disadvantage of this process is that the gap opening of the sheet die has to be adapted in each specific instance to the desired thickness of the photopolymer layer leaving the calender roll gap. A further disadvantage is the direct feed of the melt from the twin-screw extruder into the sheet die. As is known, a twin-screw extruder is distinguished by batchwise delivery leading to pressure pulsations (cf., for example, "Der Extruder als Plastifiziereinheit" (The extruder as plasticizing unit), p. 114/115, VDI-Verlag, Dusseldorf 1977). The result is a non-uniform discharge of the melt into the calender roll gap, which has adverse effects on the consistency of the thickness of the photopolymer plates. A further disadvantage is the presence of a rolling bead in the calender gap, which may give rise to air being sucked into the thermoplastic material, which can have adverse effects on the transparency and shelf life of the product.

SUMMARY OF THE INVENTION

It is therefore an object of the present invention to provide a continuous process for the manufacture of photopolymer plates having a highly homogeneous composition and a highly precise and constant thickness, which does not have the disadvantages of the prior art processes and enables in particular a high variability in the selection range of thickness of the plates.

In accomplishing the foregoing objects, there is provided according to the present invention a continuous process for the manufacture of photopolymer plates, comprising the steps of:

(a) introducing into a screw extruder a photopolymerizable mixture comprising at least one thermoplastic elastomeric polymer, at least one ethylenically mono- or poly-unsaturated compound which can be polymerized by free radicals and has a boiling point of more than about 100° C. at atmospheric pressure and at least one compound capable of initiating polymerization of said unsaturated compound upon exposure to actinic light;

(b) melting and degassing the mixture in the extruder to form a melt;

(c) metering the melt into a sheet die; and (d) then conveying the melt into a roll gap of a two-roll calender at such a rate that substantially no rotating bead is formed in the roll gap.

The amount and rate of melt conveyed into the roll gap is controlled by carefully metering the melt into the sheet-die via a melt metering pump. A preferred embodiment for preventing further formation of a rotating bead comprises controlling the rotational speed of the rolls of the two-roll calender in relation to the speed of the metering pump. In addition, the pressure in the sheet die may be measured and the rotational speed of the rolls controlled in relation thereto such that substantially no rotating bead is formed.

Further objects, features and advantages, of the present invention will become apparent from the detailed description of preferred embodiments that follows.

DETAILED DESCRIPTION OF THE PREFERRED EMBODIMENTS

The present invention comprises a continuous process for the manufacture of photopolymer plates, in which a photopolymerizable mixture having at least one thermoplastic elastomeric polymer, at least one ethylenically mono- or polyunsaturated compound which can be polymerized by free radicals and has a boiling point of more than 100° C. at atmospheric pressure, and at least one compound or combination of compounds capable of initiating polymerization of the unsaturated compounds upon exposure to actinic light, is metered into a screw extruder, melted and degassed therein and then conveyed to a two-roll calender using a sheet die, which includes transporting the melt further downstream from the screw extruder into the sheet die via a melt metering pump and conveying it to the two-roll calender at such a rate that substantially no rotating bead is formed in the roll gap.

The photopolymer plates manufactured according to the present invention have the following characteristics:
  high precision of thickness,
  high constancy of thickness,
  excellent flatness within the laminate,
  long shelf life,
  low tendency to speck formation, high transparency and high homogeneity of the layer components.

The process according to the present invention ensures that the photopolymerizable mixture can be processed to a high quality but with substantially no stress on the product. This is achieved in particular by an extremely constant material flow and only a very low temperature gradient over the width of the material flow.

Photopolymerizable mixtures useful in the process according to the present invention include the below-described components.

Thermoplastic polymers which can be used in the inventive process, alone or in a mixture with each other, include polyethylene, polypropylene, polyvinyl chloride, styrene polymers, in particular styrene/diene copolymers, butadiene and/or isoprene polymers, butadiene/acrylonitrile copolymers (nitrile rubbers), elastomeric polyurethanes, polyamides, polyimides, polyamidoimides, (meth)acrylate polymers, vinyl chloride/vinyl acetate copolymers, vinylidene chloride polymers, vinyl ester polymers, in particular vinyl acetate or vinyl propionate polymers, polyvinyl alcohols, and the like.

Depending on the type of the thermoplastic polymers used, the general processing conditions which are known for these polymers, such as, for example, heat stability, plasticizing, addition of auxiliaries and the like, have to be taken into account.

Particularly preferred thermoplastic polymers are polyurethanes and vinyl alcohol polymers. The thermoplastic polymers which preferably are used in addition to polyurethanes and vinyl alcohol polymers are elastomeric rubber-like polymers, such as, in particular, homopolymers of butadiene and isoprene, copolymers of butadiene and isoprene with one another and with other copolymerizable monomers, for example nitrile rubbers, such as butadiene/acrylonitrile copolymers having about 15 to 45% by weight of copolymerized acrylonitrile, carboxyl-carrying nitrile rubbers, vinyl chloride-containing nitrile rubbers and multiblock copolymers of styrene/butadiene and/or isoprene, such as AB two-block copolymers, ABA three-block copolymers, ABC three-block copolymers, as described in DE-A 2,138,582, DE-A 2,215,090 and DE-A 2,942,183, star block copolymers and partially or completely hydrogenated block copolymers of the type described.

The photopolymerizable mixtures in general include 20 to 98% by weight, preferably about 30 to 95% by weight, of the elastomeric polymer. In a particular embodiment, the polymers are used in the form of granules.

Ethylenically-unsaturated compounds useful in the present invention include low-molecular-weight liquid organic compounds, in general of low viscosity, having one or more polymerizable ethylenically-unsaturated double bonds. These compounds are polymerized, whereby polymerization is initiated preferably by free radicals so that they contribute directly to the formation of crosslinkings between the high-molecular-weight polymer chains. Preferably, those organic compounds are used which have two or more polymerizable ethylenically-unsaturated double bonds. These compounds can be used alone or in a mixture with each other. Thus, for example, in many cases, mixtures of compounds having two or more ethylenically-unsaturated double bonds are advantageous. However, it is also possible to use mixtures of organic compounds having more than one, preferably two, ethylenically-unsaturated double bonds with compounds having only one ethylenically-unsaturated double bond in the molecule. The type and amount of the compounds is dependent on the one hand on the thermoplastic polymer used and on the other hand on the desired reactivity of the sheet structures, i.e., the achievable degree of crosslinking.

The ethylenically-unsaturated compounds are in general used in amounts of about 1 to 70% by weight, preferably about 2 to 50% by weight, relative to all mixing components of the photopolymer mixture. In the mixtures of ethylenically mono-unsaturated and ethylenically polyunsaturated organic compounds, the amount of ethylenically mono-unsaturated organic compounds is usually in the range from about 10 to 50% by weight, relative to the sum of the low-molecular-weight ethylenically-unsaturated organic compounds used.

Preferably, those low-molecular-weight ethylenically unsaturated compounds are used which are compatible with the thermoplastic polymer, in particular if high demands are made on the photopolymer layer with respect to optical properties, such as, for example, clarity and transparency. Since they will be processed in the extruder, the ethylenically-unsaturated compounds used should in general have a boiling point of more than about 100° C. at atmospheric pressure.

Examples of compounds of this type are, in particular, acrylates and methacrylates of mono- or polyfunctional alcohols, such as, for example, di- and poly(meth)acrylates of ethylene glycol, di-, tri-, tetra- or polyethylene glycols having molecular weights in the range from 200 to 500, propylene glycol, butanediol, hexanediol, dodecanediol, tetradecanediol, 1,1,1-trimethylolpropane, 1,2,4-butanetriol, pentaerythritol and the like. The corresponding monoacrylates and/or monomethacrylates of the diols and polyols mentioned or of alcohols having to 8 carbon atoms, for example methanol, ethanol, propanol, butanol, 2-ethylhexanol, are also suitable. Of these, ethylene glycol monomethacrylate, 1,3-propanediol monomethacrylate, glycerol mono- and diacrylate, hexanediol diacrylate, hexanediol dimethacrylate, 2-ethylhexyl acrylate, lauryl methacrylate, stearyl methacrylate, 1,2,3-butanetriol monomethacrylate, pentaerythritol triacrylate, polyethylene glycol methyl ether acrylate, tetradecane-1,14-diolmonomethacrylate, tetradecane-1,14-dioldimethacrylate or the tris-ether of glycerol with 3 mol of N-methylolacrylamide or -methacrylamide are particularly preferred. Alkenylphosphonic or -phosphinic esters as in DE-A 3,817,424 can also be used. Fumaric esters, as described in German Patent Application P 4,001,465.7 and U.S. Pat. No. 4,179,130 are also suitable.

Photoinitiators which are used in the photopolymerizable mixture are those known compounds which have sufficient heat stability during processing of the recording materials and sufficient free radical formation upon exposure so as to initiate the polymerization of the monomers. They should absorb light in the wavelength section from about 250 to about 500 nm with the formation of free radicals. Examples of suitable photoinitiators are acyloins and derivatives thereof, such as benzoin, benzoin alkyl ethers, for example benzoin isopropyl ether, vicinal diketones and derivatives thereof, for example benzil, benzil acetals, such as benzil dimethyl ketal, fluorenones, thioxanthones, polynuclear quinones, acridines and quinoxalines; furthermore trichloromethyl-s-triazines, 2-halogenomethyl-4-vinyl-1,3,4-oxadiazole derivatives, halogenooxazoles substituted by trichloromethyl groups, carbonylmethylene heterocycles containing trihalogenomethyl groups as in DE-A 3,333,450, acylphosphine oxide compounds, as described, for example, in DE-A 3,133,419, and other phosphorus-containing photoinitiators, for example the 6-acyl(6H)-dibenz[c,e][1,2]-oxaphosphorine 6-oxides, in particular 6-(2,4,6-trimethylbenzoyl)-(6H)-dibenz[c,e][1,2]-oxaphosphorine 6-oxide, described in German Patent Application P 3,728,168. The photoinitiators can also be used in combination with one another or with coinitiators or activators, for example with Michler's ketone and derivatives thereof or 2-alkyl anthraquinone. The amount of photoinitiator is in general about 0.01 to 10% by weight, preferably about 0.5 to 5% by weight, of the photopolymerizable mixture.

It is often advantageous to add further auxiliaries and additives to the photopolymerizable mixture, for example inhibitors of thermal polymerization, such as hydroquinone and derivatives thereof, 2,6-di-tert.-butyl-p-cresol, nitrophenols, nitrosamines, such as N-nitrosodiphenylamine or salts of N-nitrosocyclohexylhydroxylamine, for example alkali metal salts or aluminum salts thereof. Further customary additives are dyes, pigments, antihalation agents, antiozonants, for example microcrystalline wax or paraffin wax, crosslinking agents, regulators, fillers, flow-improving agents and plasticizers.

In the process according to the present invention, a screw extruder, preferably a self-cleaning, uniformly rotating twin-screw extruder having at least one opening for metering in the mixing components, at least one degassing opening and one discharge opening is used for melting and homogenizing the mixing components. If only one opening is provided for metering in the mixing components, the components of the photopolymerizable mixture, the thermoplastic polymer being preferably in the form of granules, are premixed separately in a mixer of a known type and are conveyed continuously to the screw extruder, preferably a twin- or multi-screw extruder. Examples of suitable mixers are ploughshare, ribbon, paddle, drum or free-falling mixers. In particular, in the case of separate premixing, a process described in German Patent Application P 4,004,510.2 is preferred. In this process, the polymer in the form of granules is mixed with the liquid components with the aid of a powder which is insoluble in the liquid mixture and has an average particle size of about 0.005 to 50 μm, before the mixture is conveyed to the twin-screw extruder.

In a preferred embodiment, it is possible, provided the extruder has several feed openings, to feed in the solid thermoplastic polymer, if appropriate, in a mixture with other solid auxiliaries and additives, into a first section of the extruder and, in a second section, to meter in the liquid components of the photopolymerizable mixture, if appropriate together with the remainder of the solid components not yet fed into the first section and to homogenize them.

The first section of the preferably used twin-screw extruder can be heated although it is preferred not to heat it and, if necessary, even to cool it. The subsequent sections are heated, if appropriate to different temperatures. The maximum temperature reached should ensure that the polymer melts, but should not cause overheating or excessively high thermal stress for the mixture.

The preferred twin-screw extruder for the process according to the present invention has in particular four sections, including a degassing section and a subsequent section for pressurization. If separate premixing of the components of the photopolymerizable mixture is effected, the mixture premixed in this manner is preferably fed into the first section.

In the heated section of the extruder where the melting and homogenizing of the mixture takes place, the structure and arrangement of the screws are such that optimum mixing and homogenizing is ensured. For example, toothed blocks and kneading blocks can be additionally present, as a result of which advantageous cross mixing also takes place. The generation of shear-force fields of different strengths leads to good dispersion. The heated section has, on average, temperatures of about 100° to 220° C., in particular about 130° to 170° C.

The melting and homogenizing section is followed by a degassing section. The melt is in general degassed by applying a suitable vacuum to the degassing opening. The degassing section can be followed by a further section for pressurization in which screw elements having decreasing pitch—when looked at in the direction of the product flow—are arranged in succession. The degassing section is preferably heated to about 60° to 140° C.

The overall screw length of the extruder is about 5 to 50 times, preferably about 10 to 40 times, the screw diameter.

In the process according to the present invention, the twin-screw extruder is followed by a screw metering pump. This is preferably a gear pump, such as described in Ullmann's Encyklopädie der technischen Chemie (Ullmann's Encyclopedia of Industrial Chemistry), Volume 3, 4th Edition (1973), Verfahrenstechnik II und Reaktionsapparate (Process technology II and Reaction apparatuses), page 169. Particularly preferred is a spur-toothed gear pump.

The melt metering pump is followed—seen in L the direction of the product flow—by a sheet die. There, the melt is distributed over the die width through flow channels of suitable structure. The die center and the die lips can be heated separately. It is advantageous for the lips to have separately heatable zones over their entire width.

The outer dimensions of the die are such that the melt leaving the die is conveyed to the gap of a two-roll calender via the shortest possible route. In the roll gap, the photopolymer mixture is shaped to the desired thickness.

In the process according to the present invention, it is essential that substantially no rotating bead is formed between the calender rolls. This ensures that substantially no air is introduced into the still moldable thermoplastic mixture. A rotating bead can lead to non-homogeneities on the surface and in the polymer plate itself which adversely affect the optical properties.

To avoid a rotating bead in the calender gap, precise metering of the melt from the sheet die into the calender gap is necessary. An excess supply of melt from the extruder causes the formation of such a rotating bead. A melt deficiency on the other hand can lead to pulsations and furthermore to sheet breakage. A slight bead formation in the calender gap nevertheless typically is unavoidable. However, any bead formation in the present invention is not comparable with the rotating bead of the prior art.

An essential feature of the process according to the present invention is therefore the introduction of the melt into the calender gap in such an amount that substantially no rotating bead is formed. At the same time, pulsations which necessarily have to be expected and which impair the constancy and precision of thickness are prevented.

One embodiment for controlling the melt supply in the calender gap is the measurement of the pressure by means of a pressure-measuring probe in the sheet die and control of the rotational speed of the calender rolls, depending on the result of such a pressure measurement. Another embodiment provides a backward control, i.e., control of the number of revolutions of the melt metering pump, optionally in combination with the above-described forward control, so as to prevent the formation of a rotating bead. In particular, a combination of said backward control with the forward control of the rotational speed is advantageous.

The high adjustability of the thickness of the extruded plates is shown by the fact that the gap width of the sheet die is adjustable in a large range from about 1.2 to 50 times, preferably about 1.5 to 50 times, in particular about 1.5 to 20 times, the calender gap width.

When leaving the calender gap, the extruded photopolymer plate has a layer thickness of about 0.1 to 20 mm, preferably about 0.2 to 10 mm.

At least one of the calender rolls carries a film as it rotates, so that together with the photopolymer plate leaving the calender gap a multi-layer element is formed. The films used are in particular biaxially-stretched but also non-crystalline polyester films. Metal foils are also suitable. Preferably, the films have been previously coated, for example, with an adhesion promoter. The polyester films may have been coated, for example, with an adhesive coating as described in DE-A 3,740,432. In the case of two films, one of the films acts as a base sheet and one as a cover sheet.

It is also possible to introduce into the calender gap a multi-layer cover element instead of a polyester film or a metal foil, which element comprises a polyester cover sheet, a polyamide layer and, if desired, a further photopolymerizable layer or a layer which becomes photopolymerizable only upon contact with an extruded photopolymer layer. Cover elements of this type are described in EP-A 0,084,851.

It is also possible to extrude the photopolymerizable material between two polyester films carried by the calender rolls, then to remove one film and to press a multi-layer cover element on instead of said film.

The photopolymer layer formed in the calender gap or the multi-layer element produced by concomitantly feeding a film or foil into the calender gap preferably leaves the calender gap at an angle of about 90° relative to the connecting line between the axes of the calender rolls.

The element or the layer is then transported further, while being cooled with air. The cooling takes place either on one side or on both sides of the element or layer. Cooling on two sides, i.e., from top and bottom, is advantageous. The further transport takes place by means of a belt, which may be perforated, and is guided over two belt rollers. Preferably, it is a nonperforated belt made of plastic or steel.

After cooling and transport on the belt, the photopolymer layer or the multi-layer element is either wound or transported further. The further transport takes place by means of a perforated take-off belt, in particular made of steel, which is also guided over two belt rollers. Below the perforated take-off belt, a vacuum box is present, by means of which the lower film is pulled onto the belt. This makes it possible to exert preferably a tensile force on the sheet-like structure leaving the roll gap.

The combination of a perforated take-off belt with a nonperforated one has the effect that cover sheet and base sheet together with the photopolymer layer form a multi-layer element homogeneously and without bubble formation and whose absolute planar surface is ensured.

In the section in which the further transport takes place on a perforated take-off belt or thereafter, exposure of the bottom surface of the layer is preferably carried out to ensure crosslinking or partial crosslinking of the layer, so that at least the base zone of the photopolymer plate is crosslinked. Such an exposure of the bottom surface facilitates the subsequent formatting of the photopolymer plates, which takes place by longitudinal or cross cutting. The longitudinal cutting is preferably carried out before the exposure of the bottom surface while the cross cutting takes place after that.

For formatting, the customary processes are suitable, such as laser beam, water jet, razor blade and rotary shear cutting, and the like.

The consistency of the thickness of the photopolymer plates prepared according to the invention is measured after the multi-layer element has been cooled and the upper cover sheet or the multi-layer cover element has been removed. The standard deviation of the values measured over the entire width of the layer has in general values of $<$ about $\pm 0.007$ mm, in particular $<$ about $\pm 0.006$ mm.

The process according to the present invention enables the manufacture of photopolymer plates having a highly constant thickness, seen in the direction of product flow, and fewer compositional nonhomogeneities compared with customary processes. Furthermore, the process enables the manufacture of plates within a wide range of thicknesses without cost-intensive rebuilding of the plant.

The process according to the present invention also has a positive effect on the advantageous planar surfaces and consistency of thickness in the laminate. The embodiment in which the cooling of the photopolymer layer takes place immediately after leaving the calender gap during the further transport on a nonperforated take-off belt provides particularly advantageous results. The image is in general applied after removal of the cover sheet by exposure to actinic light, which crosslinks the image areas. The unexposed areas and the interlayer(s), for example made of polyamide (as described in EP-A 0,084,851), which may still be present on the polymer layer(s) are removed using a conventional developer. If desired, this can be followed by an aftercuring of the layer by means of radiation and/or heat.

The examples which follow describe the particular application of the process according to the present invention. In the examples, pbv denotes parts by volume and pbw denotes parts by weight, in which pbw relates to pbv as g to cm$^3$. The percentages given are by weight, unless stated otherwise.

EXAMPLE 1

A twin-screw extruder equipped with screws rotating in the same direction, which has a screw diameter of D=90 mm and a screw length of 28 D is used. The extruder comprises four sections with a total of six zones: a feed zone of 3 D in length for metering in solids and five separately temperature-controllable zones of 5 D each in length. The screws are composed of various screw elements, which include self-cleaning conveying elements, kneading blocks and toothed blocks.

61.2 kg/h of a styrene/isoprene/styrene three-block polymer (styrene content 15% by weight) are metered into the 1st zone (feed zone). 13.8 kg/h of a liquid mixture preheated to 60° C. and comprising
21.6 pbw of hexanediol diacrylate,
10.8 pbw of hexanediol dimethacrylate,
2.5 pbw of 2,6-di-tert.-butylcresol
10.5 pbw of benzil dimethyl ketal,
5.4 pbw of microwax (protective range up to about 60° C.)
32.4 pbw of a paraffinic oil (kinematic viscosity of 250 mm$^2$/s at 20 ° C.),
16.2 pbw of an α-methylstyrene/vinyl toluene copolymer and
0.0005 pbw of Solvent Black 3
are metered into the 3rd zone (seen in the direction of processing). A degassing opening, to which a vacuum of 450 mbar is applied, is located in the 5th zone. A spur-toothed gear pump is flanged onto the end of the extruder. It is followed by a sheet die having an outlet opening of 20×450 mm. At 30 revolutions min$^{-1}$ of the screw, the zones of the extruder are temperature-controlled in such a manner that the temperature of the melt downstream from the gear pump is 147° C.

The melt leaving the die is conveyed into the gap of a two-roll calender having rolls of 1,000 mm in length and 400 mm in diameter between two 0.125 mm thick polyester films in such a manner that no rotating bead is formed. Both calender rolls have the same rotational speed.

The multi-layer element leaving the roll gap is transported further at 90° relative to the axis of the two rolls first by means of a nonperforated take-off belt and cooled from top and bottom at the same time. It is then transported further by means of a perforated steel take-off belt at a rate of 1 m/min with a vacuum box located under the perforated steel belt. The rates of the steel belt and the rolls of the calender have been synchronized.

After the multi-layer element has been cooled, the upper polyester film is removed and the thickness of the multi-layer element is measured. The average value of the thickness is 3.113 mm. The standard deviation of 38 measured values at a running time of 39 minutes, during which a measurement was carried out each minute, was ±0.005 mm in the direction of processing.

The example is repeated, setting the calender gap to such a value, without changing the sheet die, that a product thickness of 1.1 mm and in a further example of 6.0 mm is obtained.

The take-off speed is about 3 m/min in the case of the 1.1 mm-thick plate and about 0.5 m/min in the case of the 6.0 mm-thick plate.

EXAMPLE 2

The procedure as described in Example 1 is repeated, except that this time 183.6 kg/h of the three-block copolymer are metered into the feed zone and 41.4 kg/h of the preheated liquid mixture into the 3rd zone. The number of revolutions of the screw is 57 min$^{-1}$, and the temperature of the melt downstream from the gear pump is 167° C. The multi-layer element leaves the calender gap at a rate of 3 m/min. After cooling the multi-layer element and removing the upper polyester film, the average value of the thickness is 2.903 mm, and the standard deviation of 32 measured values (measured value/min) in the direction of processing is ±0.006 mm.

In this example, exposure from underneath (partial crosslinking) over the entire surface by means of a 40 W UV fluorescent lamp is also carried out during the further transport by means of the perforated take-off belt.

To test for homogeneity, samples of the photopolymer layer are removed from the multi-layer element at different places, dissolved in toluene, and the extinction coefficient in 1/g×cm at a wavelength of 600 nm is determined by measuring the absorbency. The standard deviation is 0.8% of the average value of the absorption coefficient.

What is claimed is:

1. A continuous process for the manufacture of photopolymer plates, comprising the steps of:
    (a) introducing into a screw extruder a photopolymerizable mixture comprising at least one thermoplastic elastomeric polymer, at least one ethylenically mono- or poly-unsaturated compound which can be polymerized by free radicals and has a boiling point of more than about 100° C. at atmospheric pressure and at least one compound capable of initiating polymerization of said unsaturated compound upon exposure to actinic light;
    (b) melting and degassing said mixture in said extruder to form a melt;
    (c) metering said melt into a sheet die; and then
    (d) conveying said melt into a roll gap of a two-roll calender at such a rate that substantially no rotating bead is formed in said roll gap.

2. A process according to claim 1, wherein step (c) comprises transporting said melt to said sheet die via a melt metering pump.

3. A process according to claim 2, wherein said melt metering pump comprises a spur-toothed gear pump.

4. A process according to claim 2, wherein the rotational speed of the rolls of said two-roll calender and the speed of said metering pump are controlled in such a manner that substantially no rotating bead is formed.

5. A process according to claim 4, further comprising measuring the pressure in said sheet die and controlling the rotational speed of the rolls of said two-roll calender in relation thereto such that substantially no rotating bead is formed.

6. A process according to claim 1, wherein said screw extruder comprises a self-cleaning twin-screw extruder.

7. A process according to claim 1, wherein said screw extruder comprises a kneading block, a toothed block, at least one opening for the metering in of said mixture, at least one degassing section and a discharge opening.

8. A process according to claim 7, wherein step (a) comprises metering solid components of said mixture into a first feed opening of an unheated first section of said extruder and metering liquid components of said mixture into at least one second feed opening of at least one subsequent heated section of said extruder.

9. A process according to claim 1, further comprising premixing the components of said photopolymerizable mixture prior to introducing said components into said extruder.

10. A process according to claim 9, wherein said premixing is effected in a ploughshare, ribbon, paddle, drum or free-falling mixer.

11. A process according to claim 10, wherein a powder which is insoluble in the liquid components of said mixture and has an average particle size of about 0.005 to 50 μm is admixed to the premixture, and said thermoplastic polymer is used in the form of granules.

12. A process according to claim 1, further comprising heating at least one section of said extruder to an average temperature of about 100° to 220° C.

13. A process according to claim 12, wherein said heated section is at a temperature of about 130° to 170° C.

14. A process according to claim 7, further comprising heating said degassing section to a temperature of about 60° to 140° C.

15. A process according to claim 1, wherein the overall screw length of said extruder is about 5 to 50 times the screw diameter.

16. A process according to claim 15, wherein the overall screw length of said extruder is about 10 to 40 times the screw diameter.

17. A process according to claim 1, wherein the gap width of said sheet die is about 1.2 to 50 times the calender gap width.

18. A process according to claim 17, wherein the gap width of said sheet die is about 1.5 to 50 times the calender gap width.

19. A process according to claim 1, further comprising a step (e) of applying at least one layer to the photopolymer layer produced in said calender to form a multi-layer element.

20. A process according to claim 19, wherein step (e) is effected by carrying a film on each roll of said calender as they rotate.

21. A process according to claim 1, wherein the product sheet produced in said calender gap leaves said calender gap at an angle of about 90° relative to the connecting line between the axes of said calender rolls.

22. A process according to claim 21, further comprising transporting said product sheet produced in said calender gap by means of a first take-off belt.

23. A process according to claim 22, wherein said first take-off belt comprises a nonperforated take-off belt.

24. A process according to claim 22, further comprising cooling concurrently the top and bottom of said product sheet.

25. A process according to claim 22, further comprising additionally transporting said product sheet by means of a perforated second take-off belt.

26. A process according to claim 25, further comprising applying a vacuum to said product sheet so as to secure said product sheet on said belt.

27. A process according to claim 22, further comprising partially exposing the bottom surface of said product sheet during said transporting.

* * * * *